(12) United States Patent
Kunitani et al.

(10) Patent No.: US 6,492,921 B1
(45) Date of Patent: Dec. 10, 2002

(54) DEVICE FOR CLAMPING MULTIPLE SIGNALS

(75) Inventors: Hisao Kunitani, Kyoto (JP); Atsuhisa Kageyama, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/856,874

(22) PCT Filed: Mar. 22, 2000

(86) PCT No.: PCT/JP00/01747

§ 371 (c)(1),
(2), (4) Date: May 29, 2001

(87) PCT Pub. No.: WO00/57556

PCT Pub. Date: Sep. 28, 2000

(30) Foreign Application Priority Data

Mar. 24, 1999 (JP) ............................................. 11-079686

(51) Int. Cl.⁷ ................................................. H03M 1/10
(52) U.S. Cl. ....................................... 341/118; 341/155
(58) Field of Search .................................. 341/118, 155

(56) References Cited

U.S. PATENT DOCUMENTS

| 5,084,700 A | 1/1992 | Christopher | |
|---|---|---|---|
| 5,371,552 A | * 12/1994 | Brummette et al. | ........ 341/118 |
| 5,731,771 A | * 3/1998 | Chesneau | ................... 341/118 |

FOREIGN PATENT DOCUMENTS

| JP | 4-242377 | 8/1992 |
|---|---|---|
| JP | 5-83594 | 4/1993 |
| JP | 5-211441 | 8/1993 |
| JP | 8-84271 | 3/1996 |
| JP | 9-83835 | 3/1997 |
| JP | 9-246970 | 9/1997 |
| JP | 9-247497 | 9/1997 |

* cited by examiner

*Primary Examiner*—Howard L. Williams
(74) *Attorney, Agent, or Firm*—McDermott, Will & Emery (57) ABSTRACT

A large number of analog signals (Aa, Ba . . . Na) are time-division-multiplexed by an analog switch (12) into a single analog signal (c). The multiplexed analog signal (c) is converted by an A/D conversion circuit (8) into a digital signal (d). The digital signal (d) is separated by a signal separation circuit (14) into a large number of digital signals (e) respectively corresponding to the analog signals (Aa, Ba . . . Na). Each digital signal (e) is compared by a comparison circuit (9) with a digital reference value (f) having a predetermined value. A current source control circuit (10) generates a digital control signal (g) according to the amount of shift in the digital signal (e) with respect to the digital reference value (f), and the current source (11) is controlled by the control signal (g). Therefore, the clamp level of an analog signal is adjusted to a predetermined level with a high precision, thereby effectively suppressing the level shift thereof.

2 Claims, 7 Drawing Sheets

ANALOG SIGNAL

Fig. 2(b)

DIGITAL SIGNAL

Fig. 2(c)

CONTROL SIGNAL

Fig. 5(a) ANALOG SIGNAL

Fig. 5(b) DIGITAL SIGNAL

Fig. 5(c) DIGITAL SIGNAL

Fig. 5(d) CONTROL SIGNAL

DEVICE FOR CLAMPING MULTIPLE SIGNALS

TECHNICAL FIELD

The present invention relates to a device for clamping multiple signals, and more particularly a digital clamping device, which suppresses a direct-current shift in a video signal, or the like.

BACKGROUND ART

Figure 6:
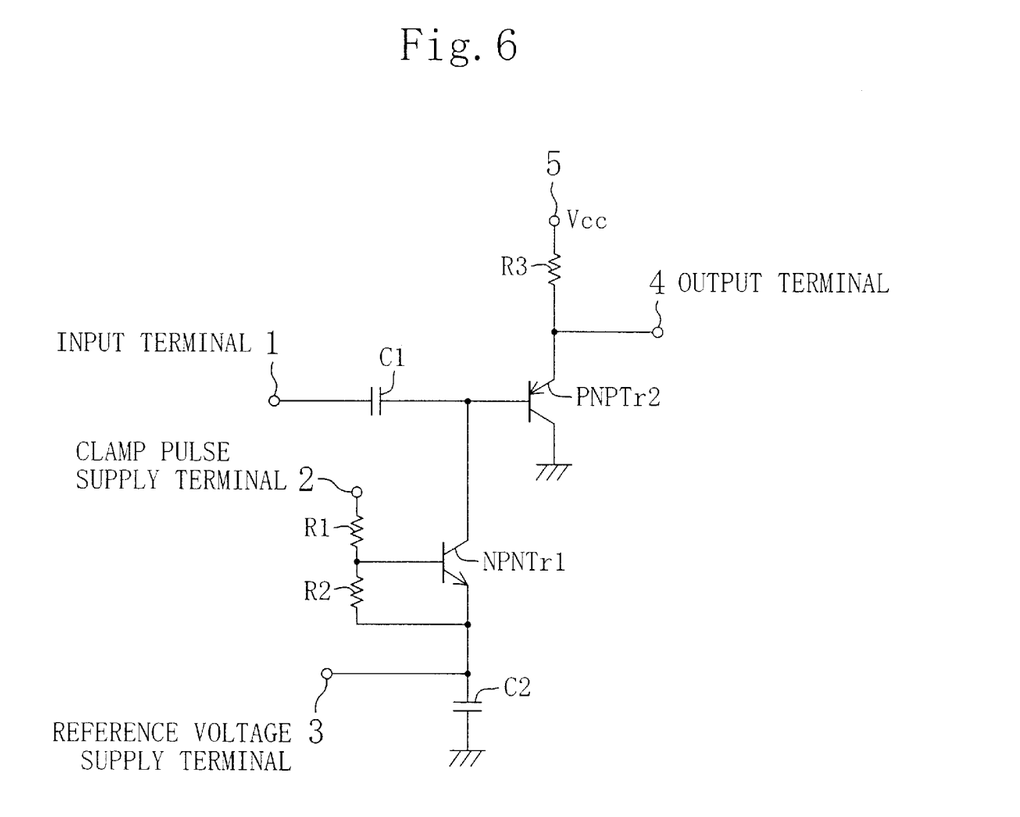
FIG. 6 is a diagram illustrating a circuit configuration of a conventional analog clamping device.

A configuration a conventional analog clamping device is illustrated in a circuit diagram of FIG. 6. The configuration of the analog clamping device of FIG. 6 will be described. The base of a PNP transistor Tr2 (hereinafter referred to as "Tr2") and the collector of an NPN transistor Tr1 (hereinafter referred to as "Tr1") are connected to an input terminal 1 via a condenser C1. The base of Tr1 is connected to a clamp pulse supply terminal 2 via a resistor R1, and is connected to the emitter of Tr1 via a resistor R2. The emitter of Tr1 is connected to a reference voltage supply terminal 3 from a reference resistor of an A/D conversion section (not shown), and is grounded via a condenser C2. The emitter of Tr2 is connected to an output terminal 4, and is connected to a Vcc voltage application terminal 5 via a resistor R3, and the collector of Tr2 is grounded.

Figure 7A:
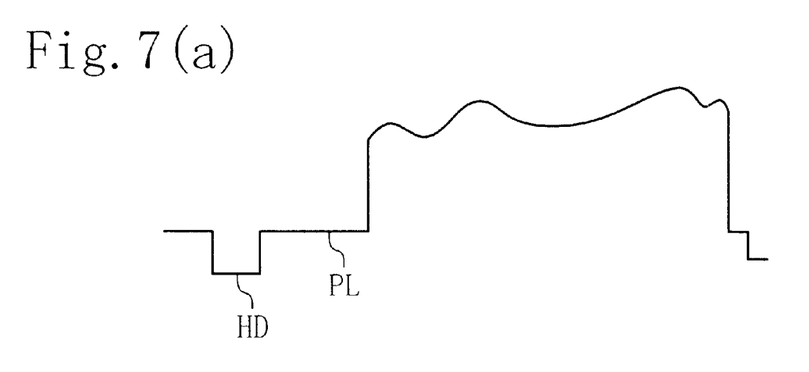
FIG. 7(a) is a waveform diagram illustrating an analog video signal which is input to the analog clamping device.
Figure 7B:
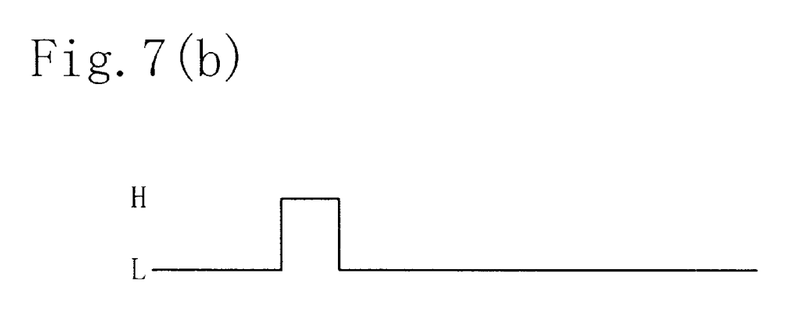
FIG. 7(b) is a waveform diagram illustrating a clamp pulse which is input to the analog clamping device.

Next, the outline of the operation will be described using waveform diagrams illustrated in FIG. 7 for the respective sections in FIG. 6. That is, a reference voltage is supplied to the emitter of Tr1 from the reference voltage supply terminal 3, and a clamp pulse which is as illustrated in FIG. 7(b) with respect to one line of video signal is supplied to the base of Tr1 from the clamp pulse supply terminal 2. Tr1 operates only when the clamp pulse is at an "H"level and, during the operation, the collector voltage of Tr1 is applied to the base of Tr2, thereby performing a clamping operation at a pedestal level PL of a video signal as illustrated in FIG. 7(a) which is supplied to the input terminal 1. Note that in FIG. 7(a), HD denotes a horizontal synchronization signal.

However, the conventional configuration as described above has a problem that when the power supply voltage Vcc shifts, the clamp voltage itself also shifts following the power supply voltage. Moreover, there is also a problem that due to a variation error in the reference resistance in the A/D conversion section which is not shown, the reference voltage supplied to the reference voltage supply terminal 3 shifts, whereby the pedestal level PL of the video signal shifts.

Moreover, the conventional configuration as described above also has a problem that it is difficult to finely adjust the clamp level because only one type of bias adjustment is performed.

Moreover, the conventional configuration as described above also has a problem that it uses one A-D conversion circuit for one input terminal 1, so that for multiple analog signal inputs, it requires the same number of A-D conversion circuits as the number of input signals, thereby increasing the circuit scale accordingly.

The present invention has been made to solve the above-described problems in the prior art, and has an object to provide a device for clamping multiple signals in which the precision in controlling the clamp level is increased and which is capable of finely adjusting the amount of shift with respect to a digital reference value. Moreover, the present invention also has an object to reduce the circuit scale by using a single A/D conversion circuit in a shared manner when clamping a large number of analog signals individually.

DISCLOSURE OF THE INVENTION

In order to achieve the objects described above, a device for clamping multiple signals according to the present invention includes: input means to which an analog signal is input and which cuts off a direct-current component of the analog signal by a capacitor; A-D conversion means for converting the analog signal, whose direct-current component has been cut off by the capacitor, into a digital signal; comparison means for comparing the digital signal, which has been obtained through conversion by the A-D conversion means, with a digital reference value having g a predetermined value; a current source for adjusting a clamp level of the analog signal; and control means for controlling the current source based on a digital signal which is obtained as a result of the comparison by the comparison means.

Moreover, in accordance with the present invention the comparison means outputs a digital shift amount signal, which is an amount of shift in the digital signal obtained through conversion by the A-D conversion means with respect to the digital reference value; and the current source includes a plurality of transistors having different output levels, and the plurality of transistors are controlled by the digital shift amount signal which is output from the comparison means.

Furthermore, in one embodiment, the present invention includes: input means to which a plurality of analog signals are input and which cuts off direct-current components of the plurality of analog signals by a plurality of capacitors; time division multiplexing means for time-division-multiplexing the plurality of analog signals, whose direct-current components have been cut off by the plurality of capacitors, by using an analog switch; one A-D conversion means for converting an analog signal, which has been obtained through time division multiplexing by the time division multiplexing means, into a digital signal; signal separation means for separating the digital signal, which has been obtained through conversion by the A-D conversion means, so as to respectively correspond to the plurality of analog signals input to the input means; switching control means for controlling the analog switch and the signal separation means; comparison means for comparing a plurality of digital signals, which have been obtained through separation by the signal separation means, with a plurality of digital reference values each having a predetermined value; a current source for individually adjusting clamp levels of the plurality of analog signals input to the input means; and control means for controlling the current source based on a digital signal obtained as a result of the comparison by the comparison means.

In addition, in one embodiment, the present invention includes: input means to which a plurality of analog signals are input and which cuts off direct-current components of the plurality of analog signals by a plurality of capacitors; time division multiplexing means for time-division-multiplexing the plurality of analog signals, whose direct-current components have been cut off by the plurality of capacitors, by using an analog switch; one A-D conversion means for converting an analog signal, which has been obtained through time division multiplexing by the time division multiplexing means, into a digital signal; signal separation means for separating the digital signal, which has been obtained through conversion by the A-D conversion means, so as to respectively correspond to the plurality of analog signals input to the input means;

switching control means for controlling the analog switch and the signal separation means; comparison means for comparing a plurality of digital signals, which have been obtained through separation by the signal separation means, with a plurality of digital reference values each having a predetermined value; a current source for individually adjusting clamp levels of the plurality of analog signals input to the input means; and control means for controlling the current source based on a digital signal obtained as a result of the comparison by the comparison means.

Moreover, in one embodiment, the control means generates a control signal which turns ON a transistor having a high output level, or a large number of transistors, among those included in the current source if the digital shift amount signal output from the comparison means is high; generates a control signal which turns ON a transistor having a low output level, or a small number of transistors, if the digital shift amount signal is low; and turns OFF all of the transistors included in the current source if the digital shift amount signal is zero.

Furthermore, in one embodiment, MOS transistors, analog transistors or diodes are used as the plurality of transistors having different output levels included in the current source.

With the above-described configuration, according to the present invention, an input analog signal is converted by A-D conversion means into a digital signal, and a current source is controlled by using a digital signal which is obtained as a result of the comparison between the digital signal and a digital reference value, so as to adjust the clamp level of the analog signal, whereby it is possible to adjust the clamp level of an analog signal with a high precision with substantially no influence of noise.

Moreover, in one embodiment, a plurality of transistors having different output levels which are provided in the current source are turned ON/OFF based on the amount of shift in the A-D-converted digital signal with respect to a digital reference value having a predetermined value, whereby the clamp level of an analog signal is finely adjusted.

Furthermore, in a case where a large number of analog signals are input, these analog signals are time-division-multiplexed by time division multiplexing means, and a single analog signal obtained through time division multiplexing is converted by single A-D conversion means into a single digital signal, whereby only one A-D conversion circuit is required. Moreover, after the digital signal obtained through conversion by the A-D conversion means is separated by signal separation means so as to respectively correspond to the input analog signals, the plurality of digital signals obtained through separation are respectively compared with corresponding digital reference values each having a predetermined value, so as to control current sources based on the comparison results, thereby adjusting the respective clamp levels of the large number of input analog signals.

In addition, in one embodiment, the current sources are provided respectively for the plurality of input analog signals, and digital shift amount signals are output from the comparison means respectively for the plurality of input analog signals, so that the digital shift amount signals are used to respectively control the corresponding current sources, thereby adjusting the respective clamp levels of the plurality of input analog signals.

Moreover, according to the present invention, the output level of the transistor, or the number of transistors, to be turned ON varies depending upon the magnitude of the digital shift amount signal, whereby the clamp level of an input analog signal is quickly and finely controlled.

Furthermore, according to one embodiment of the invention, MOS transistors, analog transistors, and the like, are used as the plurality of transistors included in the current source.

With the above-described configuration, according to the invention of claim 1, an input analog signal is converted by A-D conversion means into a digital signal, and a current source is controlled by using a digital signal which is obtained as a result of the comparison between the digital signal and a digital reference value, so as to adjust the clamp level of the analog signal, whereby it is possible to adjust the clamp level of an analog signal with a high precision with substantially no influence of noise.

Moreover, according to the invention of claim 2, a plurality of transistors having different output levels which are provided in the current source are turned ON/OFF based on the amount of shift in the A-D-converted digital signal with respect to a digital reference value having a predetermined value, whereby the clamp level of an analog signal is finely adjusted.

Furthermore, according to the invention of claim 3, in a case where a large number of analog signals are input, these analog signals are time-division-multiplexed by time division multiplexing means, and a single analog signal obtained through time division multiplexing is converted by single A-D conversion means into a single digital signal, whereby only one A-D conversion circuit is required. Moreover, after the digital signal obtained through conversion by the A-D conversion means is separated by signal separation means so as to respectively correspond to the input analog signals, the plurality of digital signals obtained through separation are respectively compared with corresponding digital reference values each having a predetermined value, so as to control current sources based on the comparison results, thereby adjusting the respective clamp levels of the large number of input analog signals.

In addition, according to the invention of claim 4, the current sources are provided respectively for the plurality of input analog signals, and digital shift amount signals are output from the comparison means respectively for the plurality of input analog signals, so that the digital shift amount signals are used to respectively control the corresponding current sources, thereby adjusting the respective clamp levels of the plurality of input analog signals.

Moreover, according to the invention of claim 5, the output level of the transistor, or the number of transistors, to be turned ON varies depending upon the magnitude of the digital shift amount signal, whereby the clamp level of an input analog signal is quickly and finely controlled.

Furthermore, according to the invention of claim 6, MOS transistors, analog transistors, and the like, are used as the plurality of transistors included in the current source, and therefore these transistors can be provided in a semiconductor device, or the like.

BEST MODE FOR CARRYING OUT THE INVENTION

Various embodiments of the present invention will now be described with reference to FIG. 1 to FIG. 5.

FIRST EMBODIMENT

A device for clamping multiple signals of the present invention will now be described with reference to FIG. 1, FIG. 2 and FIG. 3.

Figure 1:
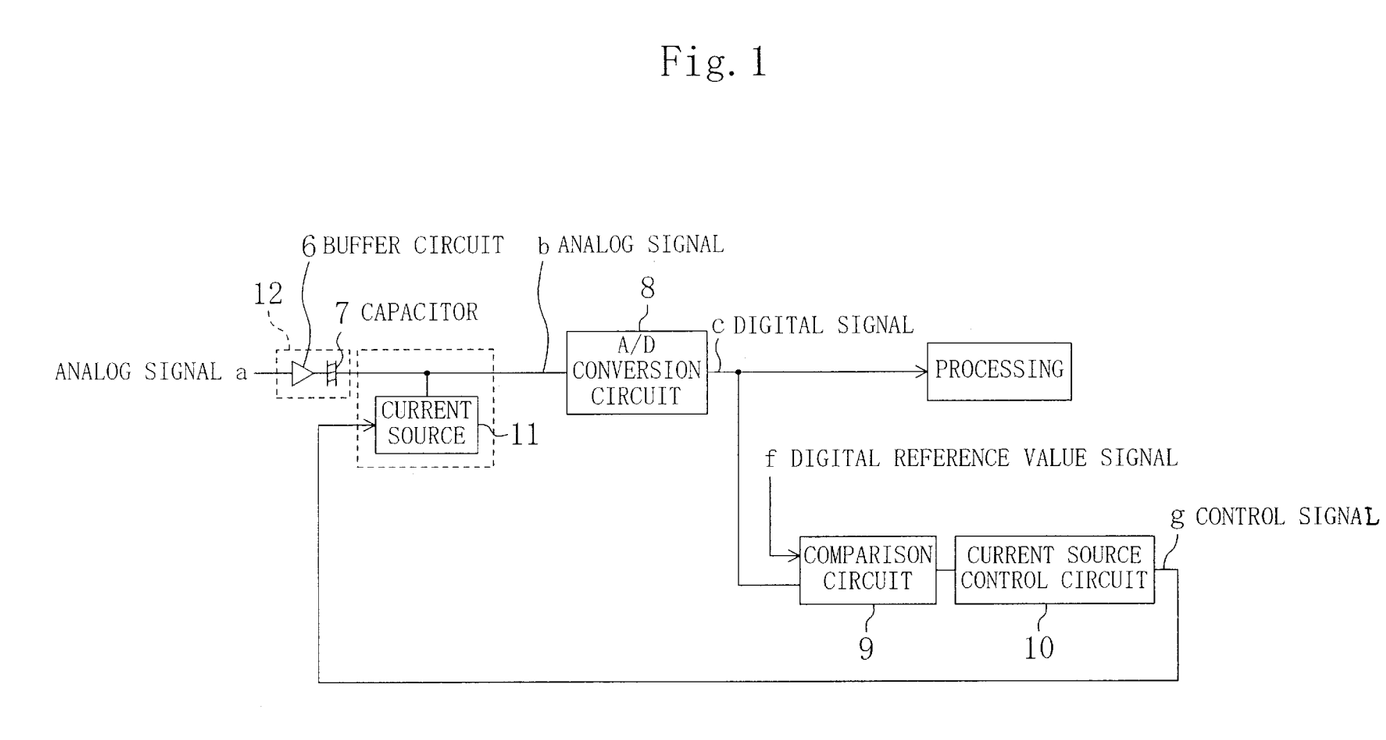
FIG. 1 is a block diagram of a device for clamping multiple signals illustrating the first embodiment of the present invention.

FIG. 1 shows a block diagram of the device for clamping multiple signals according to the first embodiment of the present invention.

In FIG. 1, 12 denotes input means to which an analog signal a is input. In the input means 12, 6 denotes a buffer circuit for buffering the input analog signal a, and 7 denotes a capacitor for cutting off a direct-current (DC) component after buffering the input of the analog signal a.

Moreover, 8 denotes an A-D conversion circuit (A-D conversion means) for converting an analog signal b, from which the DC component has been cut off by the capacitor 7, and 9 denotes a comparison circuit (comparison means) for comparing an A-D-converted digital signal c with a digital reference value f having a predetermined value corresponding to the pedestal level, so as to output a shift level (digital shift amount signal) of the digital signal c with respect to the digital reference value f having the predetermined value corresponding to the pedestal level.

Moreover, 11 denotes a current source, and the current source 11 adjusts the pedestal level (clamp level) of the analog signal b obtained after cutting off the direct current component. by the capacitor 7. 10 denotes a current source control circuit (control means) for outputting digital control signals g for adjusting the current source 11 as a result of the comparison in the comparison circuit 9, i.e., according to the shift level (digital shift amount signal) of the digital signal c with respect to the digital reference value f having the predetermined value corresponding to the pedestal level. The current source 11 is such that the output current thereof is adjusted following the digital control signal c which is output from the current source control circuit 10, and the internal configuration thereof is comprised of transistors (current sources 11A–11F . . . 11M, 11N) having a plurality of output levels, as illustrated in FIG. 3.

Figures 2A, 2B, 2C:
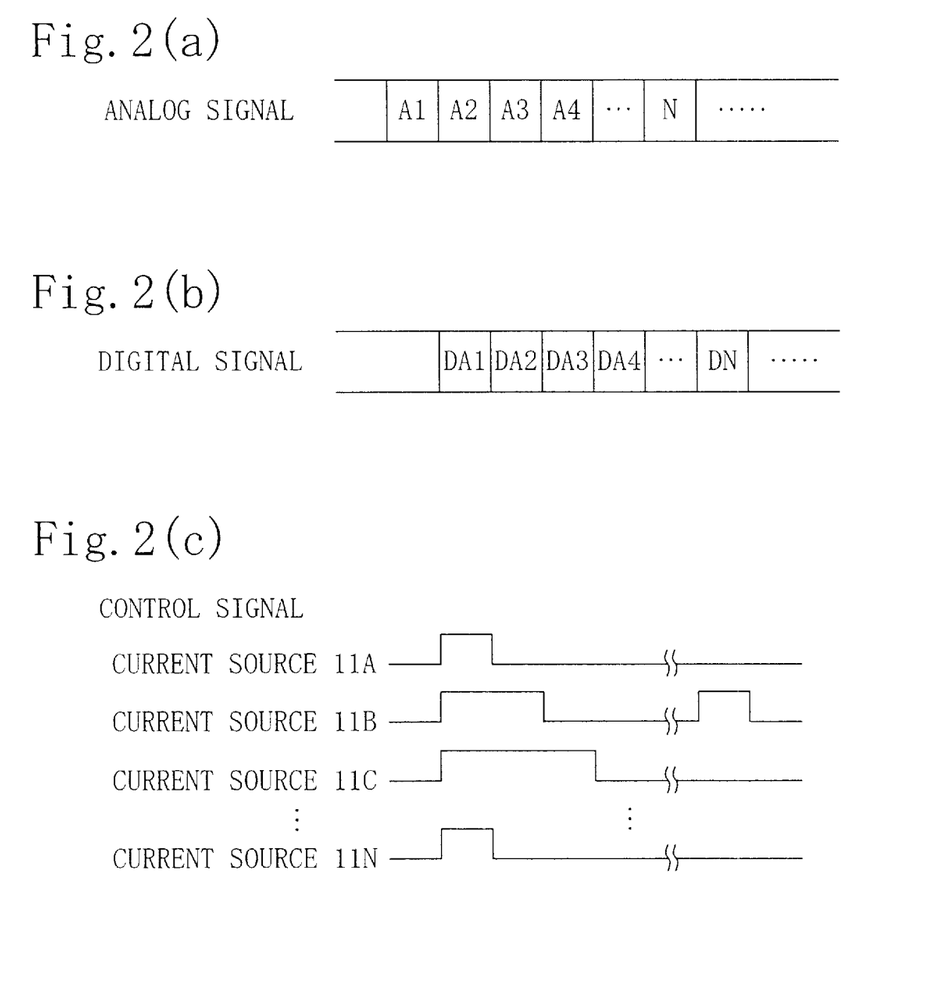
FIG. 2(a) is a diagram illustrating an analog signal which is input to the device for clamping multiple signals.
FIG. 2(b) is a diagram illustrating a digital signal which is output from an A/D conversion circuit in the clamping device.
FIG. 2(c) is a diagram illustrating a control signal which is output from a current source control circuit in the clamping device.

FIG. 2 shows signal waveform diagrams for the respective sections in FIG. 1. FIG. 2(a) illustrates analog signals A1, A2 . . . N for each line of the video signal, i.e., signals obtained by cutting off the DC component of the analog signal a corresponding to an analog video signal by the capacitor 7, FIG. 2(b) illustrates digital signals DA1, DA2 . . . DN which are obtained after A-D conversion of the analog signals A1, A2 . . . N by the A-D conversion circuit 8, and FIG. 2(c) illustrates the waveforms of control signals A–F . . . M, N for controlling the current sources 11A, 11B . . . 11N for the respective digital signals DA1, DA2 . . . DN according to shift amount signals obtained as a result of the comparison between the A-D-converted digital signals c and the digital reference value f corresponding to the pedestal level.

Figure 3:
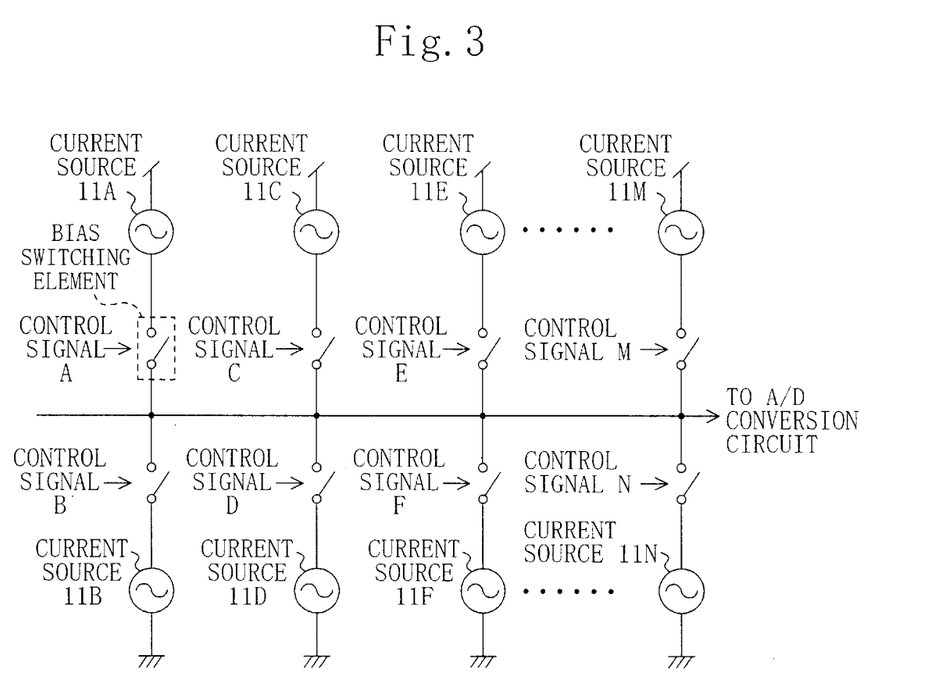
FIG. 3 is a diagram illustrating a general internal configuration of a current source which is provided in the clamping device.

FIG. 3 shows an internal configuration diagram of the current source 11 in FIG. 1, and the plurality of control signals A–F . . . N are the control signals g which are output from the current source control circuit 10 in FIG. 1. The plurality of current sources 11A, 11B . . . 11N are comprised of transistors having a plurality of output levels.

The operation of the first embodiment having a configuration as described above will be described with reference to FIG. 1, FIG. 2 and FIG. 3.

In FIG. 1, first, the analog signal a corresponding to an analog video signal is buffered by the buffer circuit 6, and the DC component of the buffered analog signal a is cut off by the capacitor 7. Then, the analog signal b whose DC component has been cut off by the capacitor 7 is analog/digital-converted by the A-D conversion circuit 8, thereby obtaining the digital signal C. The digital signal c and the digital reference value f corresponding to the pedestal level are compared with each other by the comparison circuit 9. As a result of the comparison, the control signals g for controlling the current source 11 are each generated by the current source control circuit 10 as illustrated in FIG. 2(c) according to the shift width of the digital signal c with respect to the digital reference value f. Since the control signal of FIG. 2(c) is a digital signal, it has substantially no influence of noise, whereby it is possible to control the current source 11 with a high precision.

Moreover, if the shift width of the digital signal c with respect to the digital reference value f is large, a control signal g which turns ON a transistor of the current source 11 having a high output level is generated, whereas if the shift is small, a control signal g which turns ON a transistor of the current source 11 having a low output level is generated, and if there is no shift width, all of the transistors are turned OFF. As described above, the control signal g is used to finely control the current source 11.

The current source 11 is comprised of transistors (the plurality of current sources 11A, 11B . . . 11N) having a plurality of output levels, as illustrated in FIG. 3, and the control signals g which are output from the current source control circuit 10 of FIG. 1 respectively correspond to the plurality of control signals 11A, 11B . . . 11N of FIG. 2(c). The transistors having different output levels (the plurality of current sources 11A, 11B . . . 11N) are turned ON/OFF by the plurality of control signal 11A, 11B . . . 11N, whereby the clamp level can be finely adjusted, and the level of a portion which corresponds to the pedestal level of the analog video signal can be adjusted to the signal level of the digital reference value f with a good precision, thereby obtaining a video signal with little shift.

With the configuration and the operation as described above, the current source 11 can be finely adjusted by using the A-D-converted digital signal, whereby it is possible to precisely adjust the clamp level of a video signal with substantially no influence of noise.

Note that although the current source 11 is comprised of a plurality of transistors having different output levels in the present embodiment, it may alternatively be comprised of a large number of transistors having the same output level. In such a case, if the shift width of the digital signal c with respect to the digital reference value f is large, a control signal g which turns ON a large number of the transistors of the current source 11 may be generated, whereas if the shift width of the digital signal c is small, a control signal g which turns ON a small number of the plurality of transistors of the current source 11 may be generated.

SECOND EMBODIMENT

A device for clamping multiple signals according to the second embodiment of the present invention will now be described with reference to FIG. 3, FIG. 4 and FIG. 5.

Figure 4:
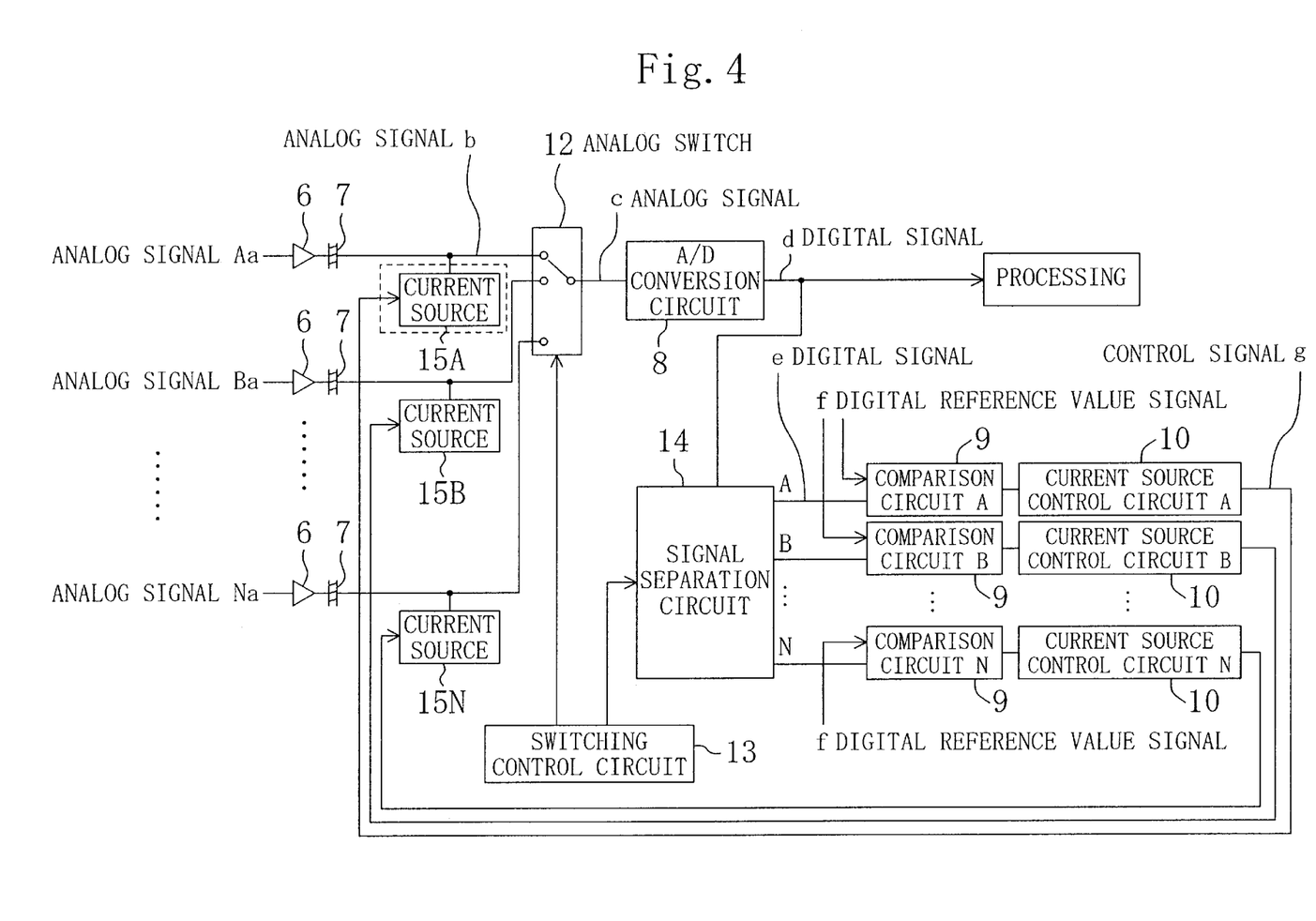
FIG. 4 is a block diagram of a device for clamping multiple signals illustrating the second embodiment of the present invention.
Figure 5A:
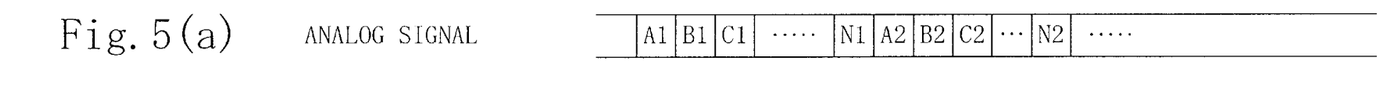
FIG. 5(a) is a diagram illustrating an analog signal which is input to the device for clamping multiple signals.
Figure 5B:
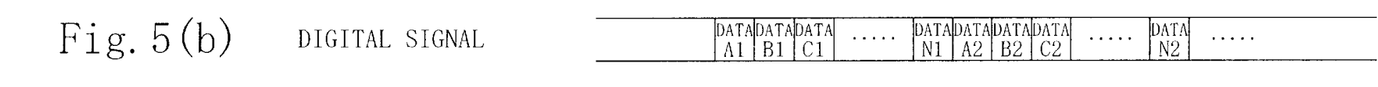
FIG. 5(b) is a diagram illustrating a digital signal which is output from an A/D conversion circuit in the clamping device.
Figure 5C:
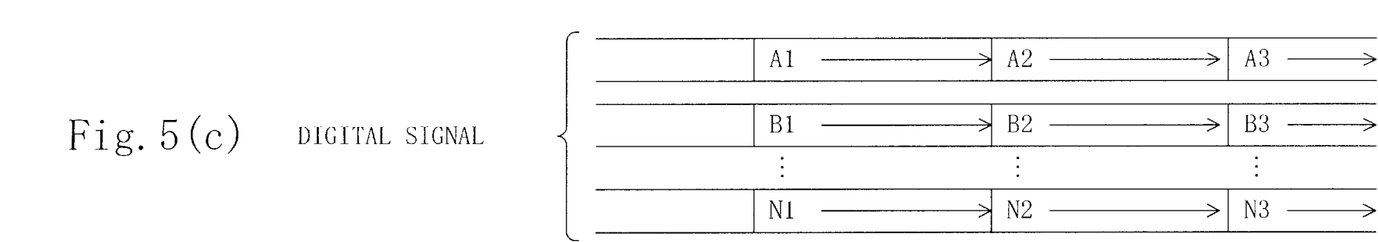
FIG. 5(c) is a diagram illustrating digital signals obtained through separation by a signal separation circuit which is provided in the clamping device.
Figure 5D:
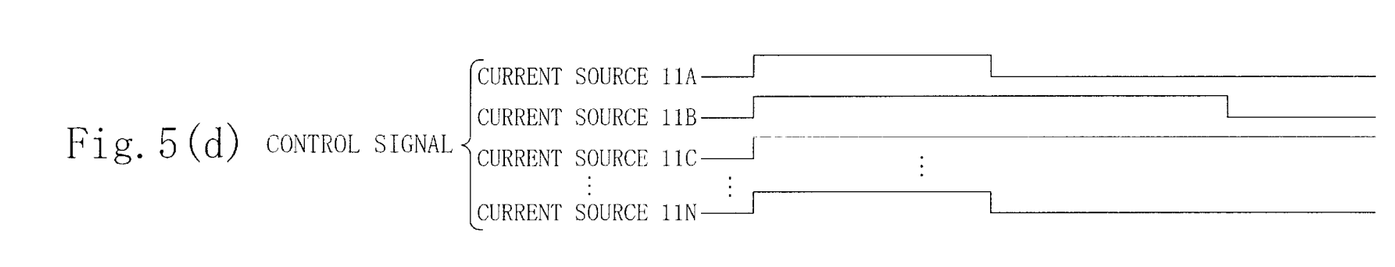
FIG. 5(d) is a diagram illustrating a control signal which is output from a current source control circuit in the clamping device.

FIG. 4 shows a block diagram of the device for clamping multiple signals according to the second embodiment of the present invention. In FIG. 4, 6 denotes a plurality of buffer circuits for buffering a plurality of analog signals Aa, Ba . . . Na, 7 denotes a plurality of capacitors for cutting off the DC component after buffering the plurality of analog signals Aa, Ba . . . Na, 8 denotes a single A-D conversion circuit for analog-digital conversion of an analog signal c which is obtained through time division multiplexing by an analog switch 12 to be described later, 9 denotes comparison circuits each comparing a digital signal e (digital signals A, B . . . N) output from a signal conversion/separation circuit 14 to be described later with a digital reference value f having a predetermined value corresponding to one of pedestal levels provided respectively for the digital signals A, B . . . N. 15A, 15B . . . 15N denote current sources which are provided respectively for the analog signals Aa, Ba . . . Na for adjusting the clamp levels (pedestal levels) of the corresponding analog signals Aa, Ba . . . Na. 10 denotes a current source control circuit for out putting the digital control signals g according to the shift levels of the digital signals A, B . . . N so as to adjust/control the corresponding current sources 11A to 11N. The current sources 11A to 11N are comprised of transistors having a plurality of output levels which are controlled according to the control signals g which are output from the current source control circuits 10, as illustrated in FIG. 3. The configuration of the present embodiment which has been described so far is as that of the first embodiment described above.

The second embodiment has a configuration having the following function in addition to the basic configuration of the first embodiment described above. That is, 12 denotes an analog switch, which forms time division multiplexing means, for time-division-multiplexing a plurality of analog signals b whose DC components have been cut off by the capacitors 7 and outputting the single time-division-multiplexed digital signal c. 14 denotes a signal separation circuit (signal separation means) for separating the digital signal c which has been converted by the single A-D conversion circuit (A-D conversion means) into digital signals A, B . . . N respectively corresponding to the plurality of analog signals Aa, Ba . . . Na. Moreover, 13 denotes a switching control circuit (switching control means) for controlling the analog switch 12 and the signal separation circuit 14, which controls the analog switch 12 when time-division-multiplexing the plurality of analog signals Aa, Ba . . . Na into a single digital signal d and controls the signal separation circuit 14 when separating the single digital signal d.

FIG. 5 shows signal waveform diagrams for the respective sections in FIG. 4. FIG. 5($a$) illustrates an analog signal for each line obtained after the analog signals b, which have been obtained by cutting off the DC components of the plurality of analog signals Aa, Ba . . . Na corresponding to an analog video signal by the plurality of capacitors 7, are further time-division-multiplexed by the analog switch 12, FIG. 5($b$) shows a digital signal obtained after A-D conversion of the time-division-multiplexed analog signal c by the A-D conversion circuit 8, FIG. 5(c) shows the digital signals A, B . . . N which have been separated by the signal separation circuit 14 so as to respectively correspond to the plurality of analog signals Aa, Ba . . . Na, and FIG. 5($d$) illustrates the waveforms of the control signals g for controlling the current sources 15A, 15B . . . 15N respectively for the plurality of analog signals Aa, Ba . . . Na according to the amounts of shift obtained as a result of the comparison between the separated digital signals A, B . . . N and the digital reference values f corresponding to the pedestal levels which respectively correspond to the digital signals A, B . . . N.

Note that the configuration of the current source 11 illustrated in FIG. 4 is as that of FIG. 3, and thus will not be described.

The operation of the device for clamping multiple signals of the second embodiment having a configuration as described above will be described with continued reference to FIG. 3, FIG. 4 and FIG. 5.

In FIG. 4, first, the plurality of analog signals Aa, Ba . . . Na corresponding to an analog video signal are buffered by the corresponding buffer circuits 6, and the DC components of the plurality of buffered analog signals are cut off by the plurality of capacitors 7. The analog signals b obtained by cutting off the DC components by the plurality of capacitors 7 are time-division-multiplexed by switching the analog switch 12 so as to obtain the single analog signal c. Moreover, the analog signal c is analog/digital-converted by the single A-D conversion circuit 8 so as to obtain the multiplexed digital signal d. The digital signal d is separated by the signal separation circuit 14 so as to respectively correspond to the plurality of analog signals Aa, Ba . . . Na, thereby obtaining the plurality of digital signals A, B . . . N. Then, the digital signals A, B . . . N and the respective digital reference values f corresponding to the pedestal levels thereof are compared with each other by the comparison circuits 9. As a result of the comparison, the control signals g for controlling the corresponding current sources 15A, 15B . . . 15N are generated from the respective current source control circuits 10 according to the amounts of shift in the digital signals A, B . . . N with respect to the respective digital reference values f. Since the control signals g are digital signals, they have substantially no influence of noise, whereby it is possible to control the plurality of current sources 15A, 15B . . . 15N with a high precision.

If the amount of shift in the digital signal A, B . . . N with respect to the corresponding digital reference value f is large, a control signal g which turns ON a transistor which has a high output level among the plurality of current sources (transistors having different output levels) 11A, 11B . . . 11N provided in one current source 11 is generated, whereas if the amount of shift is small, a control signal g which turns ON a transistor having a low output level is generated, and if there is no amount of shift, the transistors are turned OFF. As described above, the respective control signals g are used to control the corresponding current sources 15A, 15 . . . 15N.

The current sources 15A, 15B . . . 15N are each comprised of transistors (current sources 11A, 11B . . . 11N) having a plurality of output levels, as illustrated in FIG. 3, and one control signal g which is output from the current source control circuit 10 of FIG. 4 corresponds to the plurality of control signals A, B . . . N of FIG. 3. The transistors (the plurality of current sources 11A, 11B . . . 11N) having different output levels are turned ON/OFF with the plurality of control signals A, B . . . N, whereby fine adjustment of the clamp level is enabled and it is possible to obtain a video signal with little shift in a portion thereof corresponding to the pedestal level of the analog video signal.

With the configuration and the operation as described above, even when multiple analog signals are input, these analog signals are time-division-multiplexed by using the analog switch 12 and then analog/digital-converted by a single A-D conversion circuit, thereby producing the single multiplexed digital signal d, after which the digital signal is again separated into the plurality of digital signals A, B . . . N respectively corresponding to the plurality of analog signals so as to use these digital signals A, B . . . N to finely adjust/control the corresponding current sources 15A, 15B . . . 15N. As a result, it is possible to adjust a clamp level with a high precision and separately for each of the multiple analog signals, with substantially no influence of noise.

INDUSTRIAL APPLICABILITY

As described above, the device for clamping multiple signals according to the present invention is useful, for example, when clamping the pedestal level of a video signal at a predetermined level with a good precision, and is particularly suitable for clamping the clamp levels of multiple-signal analog signals individually at predetermined levels with a good precision using a small circuit configuration.

What is claimed is:

1. A device for clamping multiple signals, comprising:

input means to which a plurality of analog signals are input and which cuts off direct-current components of the plurality of analog signals by a plurality of capacitors;

time division multiplexing means for time-division-multiplexing the plurality of analog signals, whose direct-current components have been cut off by the plurality of capacitors, by using an analog switch;

switching control means for controlling the analog switch;

one A-D conversion means for converting an analog signal, which has been obtained through time division multiplexing by the time division multiplexing means, into a digital signal;

signal separation means for separating the digital signal, which has been obtained through conversion by the A-D conversion means, so as to respectively correspond to the plurality of analog signals input to the input means;

comparison means for comparing a plurality of digital signals, which have been obtained through separation by the signal separation means, respectively with a plurality of corresponding digital reference values each having a predetermined value to output a plurality of digital shift amount signals which are amounts of shift respectively in the plurality of digital signals, which have been obtained through separation by the signal separation means, with respect to the corresponding digital reference values;

a plurality of current sources which are provided after the input means, the number of the plurality of current sources corresponds to the number of the plurality of analog signals input to the input means and respectively adjust clamp levels thereof; and control means for controlling the plurality of current sources, wherein the plurality of current sources respectively include a plurality of transistors having different output levels, and wherein the number of the digital shift amount signals corresponds to the number of the plurality of current sources, and the control means controls the plurality of transistors of the plurality of current sources, based respectively on the digital shift amount signals from the comparison means.

2. The device for clamping multiple signals of claim 1, wherein MOS transistors, analog transistors or diodes are used as the plurality of transistors having different output levels included in the current source.

* * * * *

UNITED STATES PATENT AND TRADEMARK OFFICE
CERTIFICATE OF CORRECTION

PATENT NO.    : 6,492,921 B1
DATED         : December 10, 2002
INVENTOR(S)   : Hisao Kunitani et al.

It is certified that error appears in the above-identified patent and that said Letters Patent is hereby corrected as shown below:

<u>Title page,</u>
Item [75], Inventors, after "Kageyama" change "Ibaraki" to -- Osaka --

Signed and Sealed this

Fifteenth Day of July, 2003

JAMES E. ROGAN
*Director of the United States Patent and Trademark Office*